(12) United States Patent
Kondo

(10) Patent No.: US 8,449,785 B2
(45) Date of Patent: May 28, 2013

(54) SUBSTRATE PROCESSING METHOD

(75) Inventor: Takashi Kondo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 478 days.

(21) Appl. No.: 12/717,545

(22) Filed: Mar. 4, 2010

(65) Prior Publication Data

US 2010/0224591 A1 Sep. 9, 2010

Related U.S. Application Data

(60) Provisional application No. 61/186,915, filed on Jun. 15, 2009.

(30) Foreign Application Priority Data

Mar. 5, 2009 (JP) ................................ 2009-051629

(51) Int. Cl.
*C23F 1/00* (2006.01)

(52) U.S. Cl.
USPC ................................. 216/41; 216/46; 216/58

(58) Field of Classification Search
USPC ................. 216/41, 58, 67; 257/751; 438/221, 438/424, 425, 636, 637, 640, 723, 725
See application file for complete search history.

(56) References Cited

U.S. PATENT DOCUMENTS

| | | | | |
|---|---|---|---|---|
| 5,514,624 A | * | 5/1996 | Morozumi | ..................... 438/624 |
| 6,204,193 B1 | | 3/2001 | Jozaki | |
| 6,774,032 B1 | * | 8/2004 | Park | .............. 438/640 |
| 2004/0217086 A1 | | 11/2004 | Kawashima | |
| 2005/0070111 A1 | | 3/2005 | Kushibiki et al. | |
| 2006/0172540 A1 | | 8/2006 | Marks et al. | |
| 2006/0194439 A1 | | 8/2006 | Sadjadi et al. | |
| 2007/0163995 A1 | * | 7/2007 | Sugimoto et al. | ............... 216/67 |
| 2007/0228006 A1 | | 10/2007 | Kitamura | |
| 2007/0284337 A1 | * | 12/2007 | Mochizuki et al. | ............. 216/67 |
| 2008/0020585 A1 | | 1/2008 | Shimizu et al. | |

FOREIGN PATENT DOCUMENTS

| | | |
|---|---|---|
| JP | 11-307512 | 11/1999 |
| JP | 2001-68462 A | 3/2001 |
| JP | 2004-103925 | 4/2004 |
| JP | 2005-129893 | 5/2005 |
| JP | 2006-302924 | 11/2006 |

(Continued)

OTHER PUBLICATIONS

Plummer et al. Silicon VLSI Technology, published by Tom Robbins, 2000, p. 638-639 (Plummer).*

*Primary Examiner* — Duy Deo
*Assistant Examiner* — Erin Bergner
(74) *Attorney, Agent, or Firm* — Rothwell, Figg, Ernst & Manbeck, P.C.

(57) ABSTRACT

A substrate processing method is provided to process a substrate having a structure in which a lower photoresist layer, a hard mask layer containing silicon, and an upper photoresist layer are sequentially formed on a target layer to be processed. The substrate processing method includes reducing by using a plasma a width of a first opening formed in the upper photoresist layer, so that the hard mask layer is exposed; reducing by using a plasma a width of a second opening formed in the hard mask layer through the first opening having the reduced width so that the lower photoresist layer is exposed; forming a third opening through the second opening having the reduced width so that the target layer is exposed; and a third width reducing step of reducing a width of the third opening by using a plasma.

18 Claims, 12 Drawing Sheets

| | FOREIGN PATENT DOCUMENTS | | JP | 2008-529313 A | 7/2008 |
|---|---|---|---|---|---|
| JP | 2007-266291 | 10/2007 | JP | 2008-538857 A | 11/2008 |
| JP | 2007-273866 | 10/2007 | | | |
| JP | 2007-294842 | 11/2007 | * cited by examiner | | |

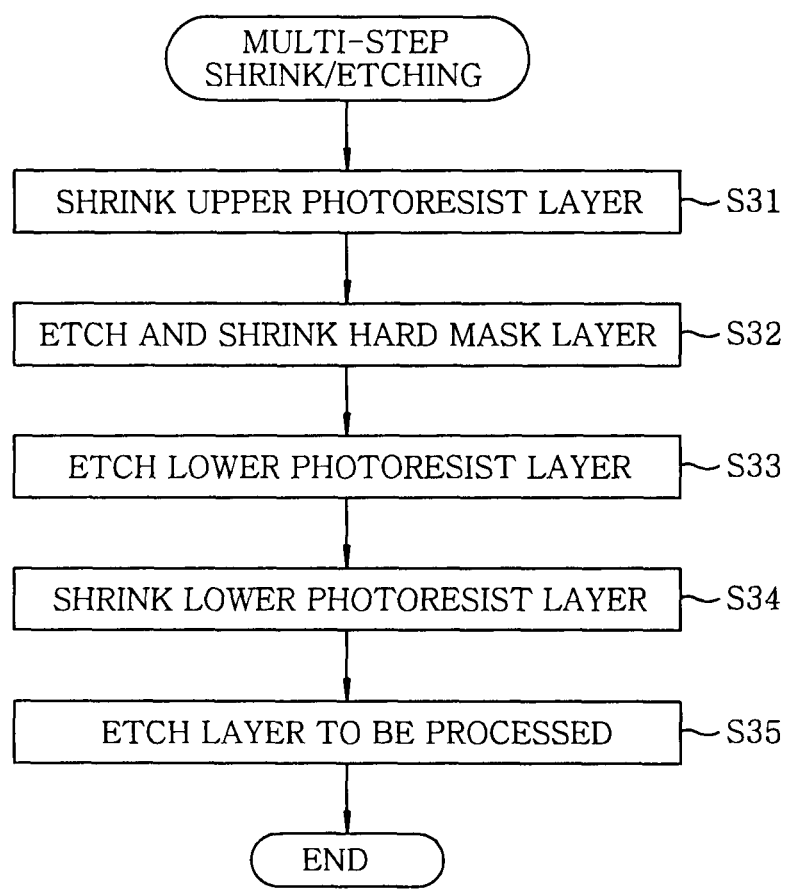

CF₄ GAS, CH₄ GAS

C₄F₈ GAS, Ar GAS, O₂ GAS

US 8,449,785 B2

SUBSTRATE PROCESSING METHOD

CROSS-REFERENCE TO RELATED APPLICATIONS

This application claims priority to Japanese Patent Application No. 2009-051629 filed on Mar. 5, 2009, the entire contents of which are incorporated herein by reference.

FIELD OF THE INVENTION

The present invention relates to a substrate processing method; and, more particularly, to a substrate processing method for reducing a width of an opening formed on a layer used as a mask.

BACKGROUND OF THE INVENTION

Along with a trend for micro-fabrication of a semiconductor device, there have been suggested various techniques for reducing a width of an opening formed on a mask layer used for plasma etching. For example, as for a method for reducing (shrinking) a width of an opening 101 in an upper photoresist layer 100 formed on a wafer as a substrate shown in FIG. 10A, there is suggested a method for using a processing gas containing $CH_4$ (methane) gas to generate a plasma because a large amount of deposits containing carbon and hydrogen can be generated from a plasma of $CH_4$ gas. Specifically, a plasma is generated from a gaseous mixture of $CH_4$ gas and Ar gas, and a deposit 102 generated from the plasma is deposited in the opening 101, thereby reducing a width W1 of the opening 101 (FIG. 10B) (see, e.g., Japanese Patent Application Publication No. 2007-273866 and corresponding U.S. Patent Publication No. 2007-284337).

Since, however, the deposit 102 is deposited isotropically, it is deposited on a bottom portion as well as a side portion of the opening 101 (see the deposit 102 having a thickness T1 shown in FIG. 10C). The deposit 102 deposited on the bottom portion retards etching of a target layer to be processed, e.g., a hard mask layer 103 containing silicon, which is formed below the photoresist layer 100.

Further, when an opening is formed in the hard mask layer 103 by performing etching using a plasma, the opening is formed to have a tapered cross section by depositing a deposit generated from the plasma in the opening. If the plasma is generated by using $C_4F_8$ gas or $C_4F_6$ gas, the plasma effectively etches the hard mask, and generates a large amount of CF-based reaction products that can be used as deposits by reaction with silicon in the hard mask layer. That is, $C_4F_8$ gas or $C_4F_6$ gas is widely used in order to improve the etching efficiency and facilitate the formation of a taper shaped opening.

However, a large amount of CF-based reaction products thus generated are adhered not only onto the opening but also onto surfaces of components in a chamber for processing a wafer. The adhered CF-based reaction products are decomposed and generate fluorine during following etching of, e.g., a lower photoresist layer formed below the hard mask layer. A plasma generated from the fluorine affects etching of the lower photoresist layer, so that the opening formed in the lower photoresist layer may not be formed in a desired shape.

Moreover, when a width of the opening formed by etching the lower photoresist layer is reduced by using the plasma generated from $C_4F_6$ gas, a large amount of CF-based reaction products is generated and deposited not only on the opening but also on the remaining hard mask layer. The CF-based reaction products deposited on the hard mask serve as a mask of the hard mask layer during following removal of the hard mask layer or the lower photoresist layer, so that it becomes difficult to remove the hard mask layer or the like.

SUMMARY OF THE INVENTION

In view of the above, the present invention provides a substrate processing method capable of preventing any adverse effect from affecting post-processes.

In accordance with a first aspect of the present invention, there is provided a substrate processing method for processing a substrate mounted on a mounting table to which a first high frequency power and a second high frequency power having a frequency higher than that of the first high frequency power are applied, the substrate having a structure in which a lower photoresist layer, a hard mask layer containing silicon, and an upper photoresist layer are sequentially formed on a target layer to be processed.

The substrate processing method includes: a first width reducing step of reducing by using a plasma a width of a first opening formed in the upper photoresist layer, so that the hard mask layer is exposed through the first opening; a second width reducing step of reducing by using a plasma a width of a second opening formed in the hard mask layer through the first opening having the reduced width so that the lower photoresist layer is exposed; a third opening forming step of forming a third opening in the lower photoresist layer through the second opening having the reduced width so that the target layer is exposed; and a third width reducing step of reducing a width of the third opening by using a plasma.

Herein, in the first width reducing step, the plasma is generated from a gaseous mixture of $CF_4$ gas and $CH_4$ gas by applying the second high frequency power to the mounting table without applying the first high frequency power to the mounting table. In the second width reducing step, the plasma is generated from a gaseous mixture including at least $CF_4$ gas and $CH_4$ gas by applying the first and the second high frequency power to the mounting table. In the third width reducing step, the plasma is generated from a gaseous mixture including at least $C_4F_8$ gas by applying the second high frequency power to the mounting table without applying the first high frequency power to the mounting table.

Further, the first and the second width reducing step may be repeated before the third opening forming step.

Further, the substrate processing method described above may further include a target layer etching step of etching the target layer through the third opening having the reduced width.

In accordance with a second aspect of the present invention, there is provided a substrate processing method for processing a substrate mounted on a mounting table to which a first high frequency power and a second high frequency power having a frequency higher than that of the first high frequency power are applied, the substrate having a structure in which a photoresist layer is formed on a target layer to be processed.

The substrate processing method includes a width reducing step of reducing by using a plasma a width of an opening formed in the photoresist film. In the width reducing step, the plasma is generated from a gaseous mixture of $CF_4$ gas and $CH_4$ gas by applying the second high frequency power to the mounting table without applying the first high frequency power to the mounting table.

In accordance with a third aspect of the present invention, there is provided a substrate processing method for processing a substrate mounted on a mounting table to which a first high frequency power and a second high frequency having a frequency higher than that of the first high frequency power are applied, the substrate in which a hard mask layer containing silicon is formed on a target layer to be processed.

The substrate processing method includes a width reducing step of forming an opening in the hard mask layer and reducing a width of the opening by using a plasma. In the width reducing step, the plasma is generated from a gaseous mixture including at least $CF_4$ gas and $CH_4$ gas by applying the first and the second high frequency power to the mounting table.

In accordance with a fourth aspect of the present invention, there is provided a substrate processing method for processing a substrate mounted on a mounting table to which a first high frequency power and a second high frequency power having a frequency higher than that of the first high frequency power are applied, the substrate having a structure in which a photoresist layer is formed on a target layer to be processed.

The substrate processing method includes a width reducing step of reducing a width of an opening formed in the photoresist layer by using a plasma. In the width reducing step, the plasma is generated from a gaseous mixture including at least $C_4F_8$ gas by applying the second high frequency power to the mounting table without applying the first high frequency power to the mounting table.

In accordance with a fifth aspect of the present invention, there is provided a substrate processing method for processing a substrate mounted on a mounting table to which a first high frequency power and a second high frequency power having a frequency higher than that of the first high frequency power are applied, the substrate having a structure in which a lower photoresist layer, a hard mask layer containing silicon, and an upper photoresist layer are sequentially formed on a target layer to be processed.

The substrate processing method includes a first width reducing step of reducing by using a plasma a width of a first opening formed in the upper photoresist layer so that the hard mask layer is exposed; a second opening forming step of forming a second opening in the hard mask layer through the first opening having the reduced width so that the lower photoresist layer is exposed; a third opening forming step of forming a third opening in the lower photoresist layer through the second opening having the reduced width so that the target layer is exposed; and a second width reducing step of reducing a width of the third opening by using a plasma.

Herein, in the first width reducing step, the plasma is generated from a gaseous mixture of $CF_4$ gas and $CH_4$ gas by applying the second high frequency power to the mounting table without applying the first high frequency power to the mounting table. In the second width reducing step, the plasma is generated from a gaseous mixture including at least $C_4F_8$ gas by applying the second high frequency power to the mounting table without applying the first high frequency power to the mounting table.

The substrate processing method described above may further include a target layer etching step of etching the target layer through the third opening having the reduced opening.

In accordance with a sixth aspect of the present invention, there is provided a substrate processing method for processing a substrate mounted on a mounting table to which a first high frequency power and a second high frequency power having a frequency higher than that of the first frequency are applied, the substrate having a structure in which a lower photoresist layer, a hard mask layer containing silicon, and an upper photoresist layer are sequentially formed on a target layer to be processed.

The substrate processing method includes a first width reducing step of reducing by using a plasma a width of a first opening formed in the upper photoresist layer so that the hard mask layer is exposed through the first opening; a second width reducing step of reducing by using a plasma a width of a second opening formed in the hard mask layer through the first opening having the reduced width so that the lower photoresist layer is exposed; and a third opening forming step of forming a third opening in the lower photoresist layer through the second opening having the reduced width so that the target layer is exposed.

Herein, in the first width reducing step, the plasma is generated from a gaseous mixture of $CF_4$ gas and $CH_4$ gas by applying the second high frequency power to the mounting table without applying the first high frequency power to the mounting table. In the second width reducing step, the plasma is generated from a gaseous mixture including at least $CF_4$ gas and $CH_4$ gas by applying the first and the second high frequency power to the mounting table.

The substrate processing method described above may further include a target layer etching step of etching the target layer through the third opening having a reduced opening.

In accordance with the substrate processing method described above, when the width of the first opening is reduced by the plasma, the plasma is generated from the gaseous mixture of $CF_4$ gas and $CH_4$ gas by applying the second high frequency power to the mounting table without applying the first high frequency power to the mounting table. In that case, the plasma of $CF_4$ gas generates deposits, and the deposits thus generated are deposited in the first opening. Meanwhile, fluorine radicals in the plasma of $CF_4$ gas are coupled with residual carbon, which is remaining after the generation of deposits in the plasma of $CH_4$ gas. Therefore, the residual carbon is prevented from being coupled with hydrogen, and this suppresses the generation of additional deposits. Further, the second high frequency power having a frequency higher than that of the first high frequency power applied to the mounting table generates a bias potential having a weak attracting force on the mounting table, and the deposits deposited on the bottom portion of the first opening are sputtered by ions in the plasma of $CF_4$ gas attracted by the bias potential. Accordingly, the deposits are not deposited on the bottom portion of the first opening.

Moreover, when the width of the second opening is reduced by the plasma while the second opening is being formed in the mask layer, the plasma is generated from the gaseous mixture including at least $CF_4$ gas and $CH_4$ gas by applying the first and the second high frequency power to the mounting table. In that case, the plasma generated from $CF_4$ gas reacts with silicon in the hard mask layer, thus generating CF-based reaction products. Although the CF-based reaction products thus generated serving as a side portion protective film are deposited on the side portion of the second opening, the plasma of $CF_4$ gas does not generate a large amount of CF-based reaction products unlike the plasma of $C_4F_8$ gas or that of $C_4F_6$ gas. Therefore, it is possible to prevent a large amount of CF-based reaction products from being adhered onto the surfaces of the components in the processing chamber for processing the substrate and the like.

When the width of the third opening is reduced by the plasma, the plasma is generated from the gaseous mixture including at least $C_4F_8$ gas by applying the second high frequency power to the mounting table without applying the first high frequency power to the mounting table. In that case, the plasma of $C_4F_8$ gas generates CF-based reaction products, and the CF-based reaction products thus generated are deposited in the third opening and on the surface of the layer formed above the layer in which the third opening is formed. However, the plasma of $C_4F_8$ gas does not generate a large amount of CF-based reaction products compared to the plasma of $C_4F_6$ gas. Further, the second high frequency power having a frequency higher than that of the first high frequency power applied to the mounting table generates a bias potential having a weak attracting force on the mounting table, and the CF-based reaction products deposited on the bottom portion of the third opening and on the surface of the layer formed above the layer in which the third opening is formed are sputtered by ions in the plasma attracted by the bias potential. Accordingly, the CF-based reaction products are not deposited on the bottom portion of the third opening and on the surface of the layer formed above the layer in which the third opening is formed.

That is, the first to the third width reducing step can prevent any adverse effect from affecting the post-processes.

In accordance with the substrate processing method described above, the first and the second width reducing step are repeated before the third width reducing step. That is, during the second width reducing step in which the second opening is being formed, the formation of the second opening in the depth direction is stopped when the bias potential having a weak attracting force on the mounting table is only generated by performing the first width reducing step. Next, by returning to the first width reducing step, the deposits generated from the plasma of $CH_4$ gas are deposited on the side portion of the second opening. As a result, the formation of a tapered shape can be facilitated, and the width of the second opening can be further reduced.

In accordance with the substrate processing method described above, the target layer is etched via the third opening having a reduced width, so that an opening having an extremely small width can be formed in the target layer.

BRIEF DESCRIPTION OF THE DRAWINGS

The other objects and features of the present invention will become apparent from the following description of embodiments, given in conjunction with the accompanying drawings, in which:

FIG. 3 presents a flowchart of the multi-step shrink/etching process as the substrate processing method in accordance with the embodiment of the present invention;

DETAILED DESCRIPTION OF THE EMBODIMENT

The embodiments of the present invention will be described with reference to the accompanying drawings which form a part hereof.

Figure 1:
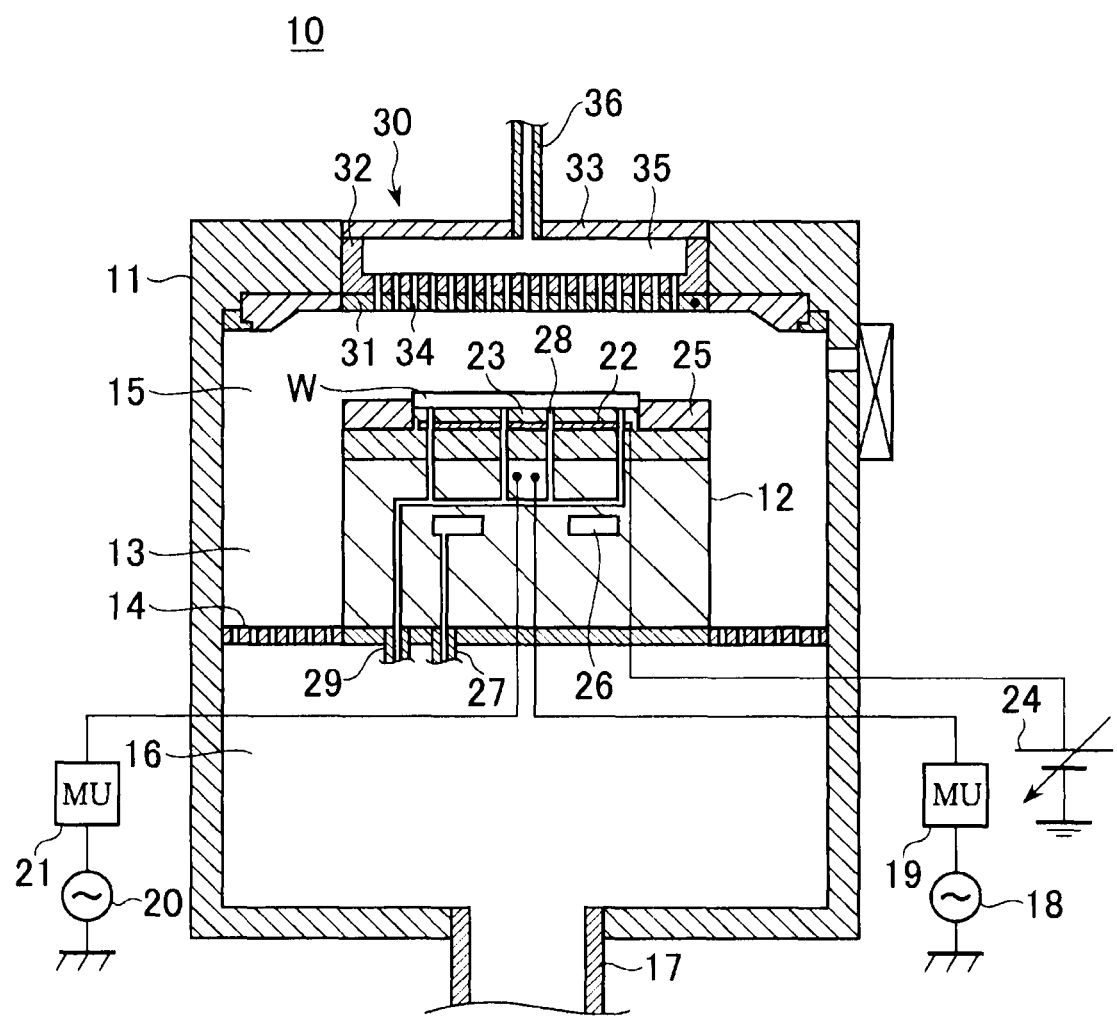
FIG. 1 is a cross sectional view schematically showing a configuration of a plasma processing apparatus for performing a multi-step shrink/etching process as a substrate processing method in accordance with an embodiment of the present invention.

FIG. 1 is a cross sectional view schematically showing a configuration of a plasma processing apparatus for performing a multi-step shrink/etching process as a substrate processing method in accordance with an embodiment of the present invention.

Referring to FIG. 1, a plasma processing apparatus 10 includes a chamber 11 for accommodating a wafer W having a diameter of, e.g., about 300 mm, and a cylindrical susceptor 12 (mounting table) for mounting thereon a wafer for a semiconductor device is disposed in the chamber 11. In the plasma processing apparatus 10, a side exhaust passageway 13 serving as a flow path for discharging a gas from a space above the susceptor 12 to the outside is defined by an inner sidewall of the chamber 11 and a side surface of the susceptor 12. A gas exhaust plate 14 is provided in the middle of the side exhaust passageway 13.

The gas exhaust plate 14 is a plate-shaped member having a plurality of through holes, and serves as a partition plate for partitioning the chamber 11 into an upper portion and a lower portion. A plasma is generated in the upper portion (hereinafter, referred to as a "reaction chamber") 15 of the chamber 11 partitioned by the gas exhaust plate 14. Further, the lower portion (hereinafter, referred to as a "gas exhaust chamber (manifold)") 16 of the chamber 11 is connected to a gas exhaust pipe 17 for discharging a gas in the chamber 11. The gas exhaust plate 14 captures or reflects the plasma generated in the reaction chamber 15 to prevent the leakage of the plasma into the manifold 16.

A TMP (Turbo Molecular Pump) and a DP (Dry Pump) (both are not shown) are connected to the gas exhaust pipe 17. These pumps evacuate the chamber 11 to reduce an inner pressure of the chamber 11 to a vacuum state. Specifically, the DP reduces the inner pressure of the chamber 11 from an atmospheric pressure to an medium vacuum pressure (e.g., about $1.3 \times 10$ Pa (0.1 Torr) or less), and the TMP operates together with the DP to reduce the inner pressure of the chamber 11 to a high vacuum pressure (e.g., about $1.3 \times 10^{-3}$ Pa ($1.0 \times 10^{-5}$ Torr) or less), which is lower than the medium vacuum pressure. Moreover, the inner pressure of the chamber 11 is controlled by an automatic pressure control (APC) valve (not shown).

The susceptor 12 in the chamber 11 is connected to a first high frequency power supply 18 via a first matching unit (MU) 19 and also connected to a second high frequency power supply 20 via a second matching unit (MU) 21. Further, the first high frequency power supply 18 supplies a high frequency power for ion attraction, which has a relatively low frequency (first frequency), e.g., about 2 MHz, to the susceptor 12. Moreover, the second high frequency power supply 20 supplies a high frequency power for plasma generation, which has a relatively high frequency (second frequency), e.g., about 100 MHz, to the susceptor 12. Accordingly, the susceptor 12 serves as an electrode. Furthermore, the first and the second matching unit 19 and 20 reduce the amount of the high frequency power reflected from the susceptor 12 to maximize the supply efficiency of the high frequency power to the susceptor 12.

An electrostatic chuck 23 having therein an electrostatic electrode plate 22 is disposed on the susceptor 12. The electrostatic chuck 23 includes a lower disc-shaped member having a predetermined diameter and an upper disc-shaped member stacked on the lower disc-shaped member and having a smaller diameter than the lower disc-shaped member. Further, the electrostatic chuck 23 is made of ceramic.

The electrostatic electrode plate 22 is connected to a DC power supply 24. When a positive DC voltage is applied to the electrostatic electrode plate 22, a negative potential is generated at a surface of the wafer W (hereinafter, referred to as a "backside surface"). Accordingly, a potential difference occurs between the electrostatic electrode plate 22 and the backside surface of the wafer W, and the wafer W is attracted to and held on the upper disc-shaped member of the electrostatic chuck 23 by a Coulomb force or a Johnsen-Rahbek force caused by the potential difference.

In addition, a ring-shaped member, i.e., a focus ring 25, is mounted on the electrostatic chuck 23 to surround the wafer W attracted thereto. The focus ring 25 is made of a conductor, e.g., single crystalline silicon, which is the same as a material of the wafer W. Since the focus ring 25 is made of a conductor, a plasma distribution region is extended from a space above the wafer W to a space above the focus ring 25. Accordingly, the plasma density at the peripheral portion of the wafer W can be maintained at a level approximately equal to that in the central portion of the wafer W. This ensures the uniformity of the plasma etching performed on the entire surface of the wafer W.

An annular coolant path 26 extending, e.g., in a circumferential direction, is provided in the susceptor 12. A low-temperature coolant, e.g., cooling water or Galden (registered trademark), is supplied from a chiller unit (not shown) to the coolant path 26 via a coolant line 27 to be circulated therein. The susceptor 12 cooled by the low-temperature coolant cools the wafer W and the focus ring 25 through the electrostatic chuck 23.

A plurality of heat transfer gas supply holes 28 are formed at a top surface of the upper disc-shaped member of the electrostatic chuck 23 to which the wafer W is attracted (hereinafter, referred to as an "attracting surface"). The heat transfer gas supply holes 28 are connected to a heat transfer gas supply unit (not shown) via a heat transfer gas supply line 29. The heat transfer gas supply unit supplies a heat transfer gas, i.e., helium (He) gas, to a gap between the attracting surface and the backside surface of the wafer W through the heat transfer gas supply holes 28. The helium gas supplied to the gap between the attracting surface and the backside surface of the wafer W efficiently transfers heat from the wafer W to the electrostatic chuck 23.

A shower head 30 is provided at a ceiling portion of the chamber 11 to face the susceptor 12. The shower head 30 includes an upper electrode 31, a cooling plate 32 for detachably suspending the upper electrode 31, and a cover 33 for covering the cooling plate 32. The upper electrode 31 is formed of a conductive disc-shaped member having a plurality of gas holes 34 formed through the upper electrode 31 in a thickness direction. Moreover, a buffer room 35 is provided inside the cooling plate 32, and a processing gas inlet line 36 is connected to the buffer room 35.

In the plasma processing apparatus 10, the processing gas supplied from the processing gas inlet line 36 to the buffer room 35 is introduced into the reaction chamber 15 through the gas holes 34, and the introduced processing gas is turned into a plasma by the high frequency power for plasma generation applied to the inside of the reaction chamber 15 from the second high frequency power supply 20 via the susceptor 12. The plasma thus generated is attracted toward the mounted wafer W by the high frequency power for ion attraction applied to the susceptor 12 from the first high frequency power, so that the wafer W is subjected to the plasma etching process.

The operation of the components of the above-described plasma processing apparatus 10 is controlled based on a program corresponding to the plasma etching process by a CPU of a control unit (not shown) of the plasma processing apparatus 10.

Figure 2:
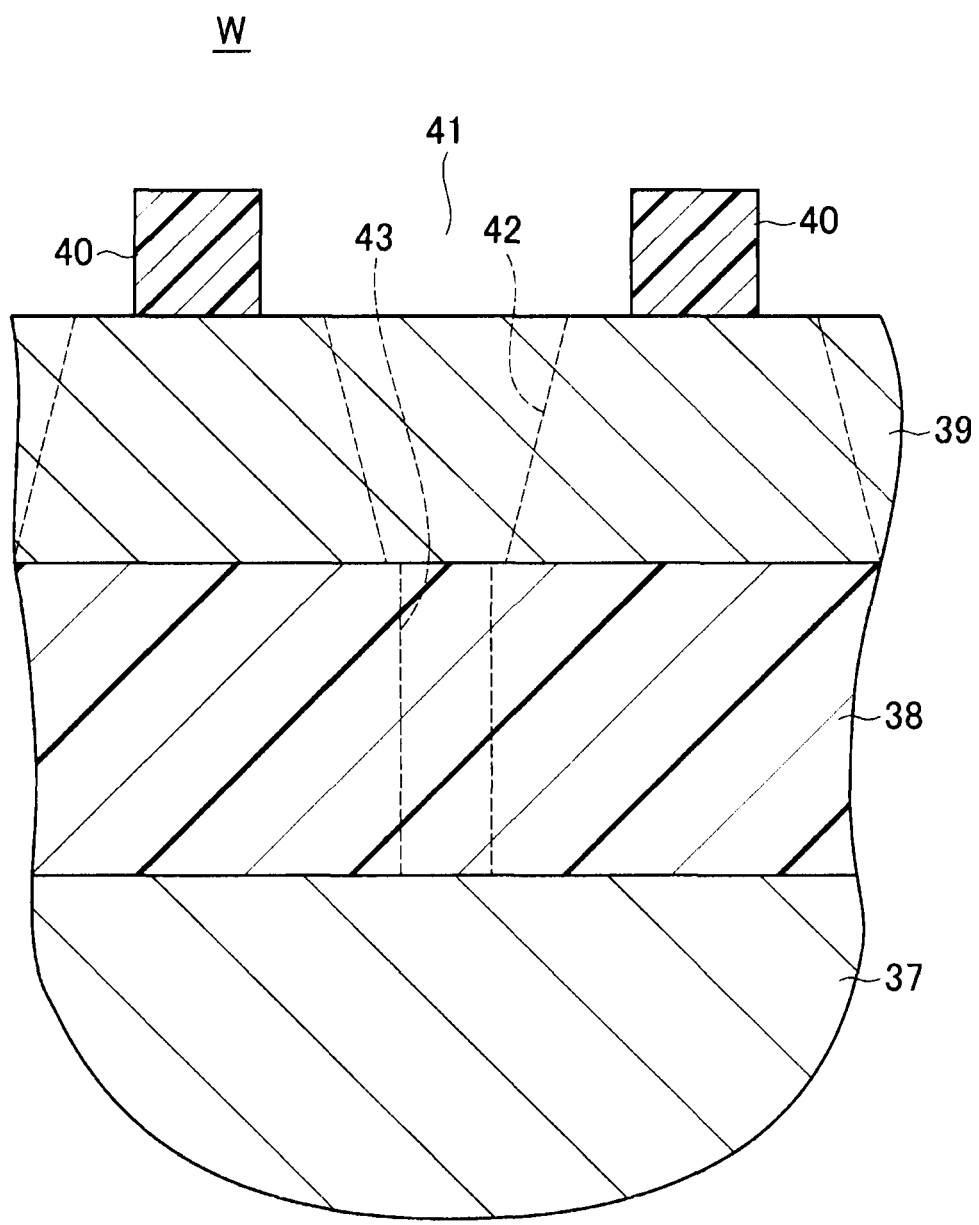
FIG. 2 provides an enlarged cross sectional view schematically describing a laminated structure of a wafer subjected to the multi-step shrink/etching process as the substrate processing method in accordance with the embodiment of the present invention.

FIG. 2 provides an enlarged cross sectional view schematically depicting a laminated structure of a wafer subjected to a multi-step shrink/etching process as a substrate processing method in accordance with an embodiment of the present invention.

Referring to FIG. 2, the wafer has a structure in which a lower photoresist layer 38, a hard mask layer 39, and an upper photoresist layer 40 are laminated in that order on a target layer to be processed 37. The lower photoresist layer 38 and the upper photoresist layer 40 are made of, e.g., positive photosensitive resin. The upper photoresist layer 40 is formed in a predetermined pattern by lithography, and has an opening 41 (first opening) through which the hard mask layer 39 is exposed. The lower photoresist layer 38 is formed of an organic film or a film mainly made of carbon.

In this wafer W, a tapered opening 42 (second opening) and an opening 43 (third opening) indicated by dashed lines in FIG. 2 are formed in the hard mask layer 39 and the lower photoresist layer 38, respectively, by a multi-step shrink/etching process to be described later. The openings 42 and 43 respectively are formed through the hard mask layer 39 and the lower photoresist layer 38 in the thickness direction thereof. The width of the opening 42 is smaller than that of the opening 41, and the width of the opening 43 is smaller than that of the opening 42.

FIG. 3 provides a flowchart describing the multi-step shrink/etching process as the substrate processing method in accordance with the embodiment of the present invention.

Referring to FIG. 3, first of all, the wafer W shown in FIG. 2 is loaded into the chamber 11. Then, the wafer W is mounted on an attracting surface of the susceptor 12 to be attracted and held on the susceptor 12.

Next, the width of the opening 41 is reduced (shrunk) by using a plasma (step S31) (first width reducing step). When the width of the opening 41 is reduced to a desired level, the hard mask layer 39 is etched by using a plasma through the opening 41 having the reduced width to form the opening 42 while reducing the width of the opening 42 (step S32) (second width reducing step).

Thereafter, when the opening 42 is formed through the hard mask layer 39 in the thickness direction thereof so that the lower photoresist layer 38 is exposed, the lower photoresist layer 38 is etched by using a plasma through the opening 42 having the reduced width to form the opening 43 (step S33) (third opening forming step).

Next, when the opening 43 is formed through the lower photoresist layer 38 in the thickness direction thereof so that the target layer 37 is exposed, the width of the opening 43 is reduced by using a plasma (step S34) (third width reducing step).

Then, when the width of the opening 43 is reduced to a desired level, the target layer 37 is etched by using a plasma through the opening 43 having the reduced width to form an opening (step S35) (target layer etching step). Thereafter, this process is completed.

Hereinafter, operations of the steps S31, S32 and S34 of FIG. 3 will be described in detail with reference to the drawings.

Figure 4A:
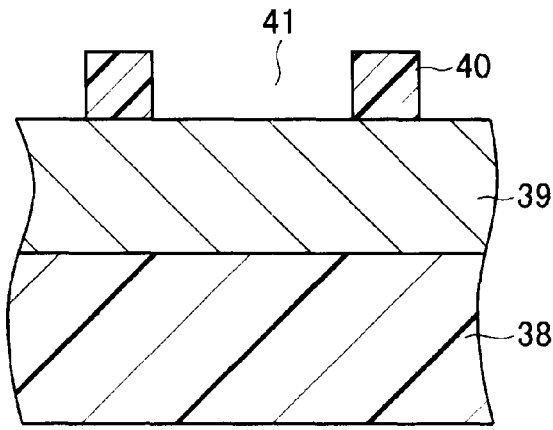
FIGS. 4A to 4C are a processing sequence of step S31 shown in FIG. 3.
Figure 4B:
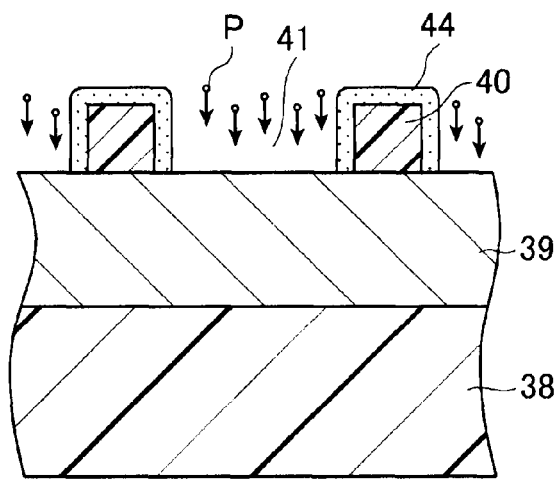
Figure 4C:
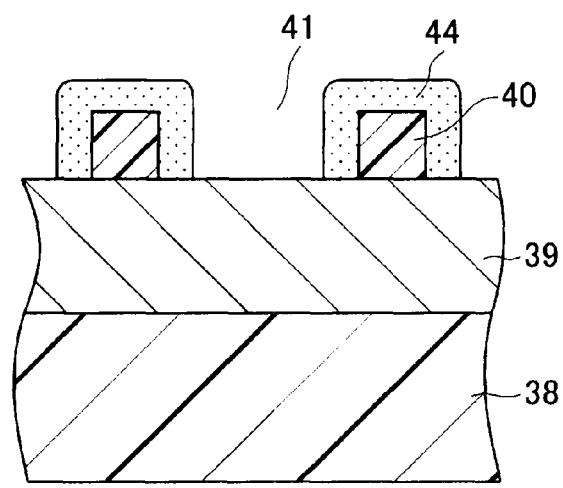

FIGS. 4A to 4C present a processing sequence of the step S31 shown in FIG. 3.

Referring to FIGS. 4A to 4C, first of all, a gaseous mixture of $CF_4$ gas and $CH_4$ gas is introduced as a processing gas from the shower head 30 into the reaction chamber 15 (FIG. 4A), and a plasma of each of $CF_4$ gas and $CH_4$ gas is generated by applying the high frequency power for plasma generation from the second high frequency power supply 20 to inside of the reaction chamber 15 via the susceptor 12. The plasma of $CH_4$ gas generates CH-based deposits 44 containing carbon and hydrogen, and the CH-based deposits 44 thus generated are deposited in the opening 41 isotropically. Meanwhile, fluorine radicals in the plasma of $CF_4$ gas are coupled with residual carbon, which is remaining after the generation of the CH-based deposits 44 in the plasma of $CH_4$ gas. Thus, the residual carbon is prevented from being coupled with hydrogen, and this suppresses the generation of additional CH-based deposits 44.

In that case, in order to prevent the hard mask layer 39 from being sputtered by the plasma of $CF_4$ gas, the high frequency power for ion attraction from the first high frequency power supply 18 is not applied to the susceptor 12. However, the high frequency power for plasma generation is applied to the susceptor 12, so that a bias potential for attracting ions P in the plasma of $CF_4$ gas is generated. Therefore, the CH-based deposits 44 deposited on the bottom portion of the opening 41 are sputtered by the ions P (FIG. 4B). As a result, only the CH-based deposits 44 deposited on the side portion of the opening 41 remain, and this leads to the reduction of the width of the opening 41.

Since, however, the high frequency power for plasma generation has a considerably high frequency, e.g., about 100 MHz, the bias potential generated by the high frequency power for plasma generation is lower than that generated by the high frequency power for ion attraction, and the ion attracting force generated by such bias potential is weak. Accordingly, the CH-based deposits 44 deposited on the bottom portion of the opening 41 are removed by sputtering by the ions P attracted toward the bottom portion of the opening 41. However, the hard mask layer 39 exposed on the bottom portion of the opening 41 is not removed by sputtering (FIG. 4C).

In accordance with the step S31 of the multi-step shrink/etching process shown in FIG. 3, the plasma is generated from the gaseous mixture of $CF_4$ gas and $CH_4$ gas by applying the high frequency power for plasma generation to the susceptor 12 without applying the high frequency power for ion attraction to the susceptor 12. Thus, the generation of additional CH-based deposits 44 is suppressed, and the CH-based deposits 44 deposited on the bottom portion of the opening 41 are sputtered by the ions P in the plasma of $CF_4$ gas. Accordingly, the CH-based deposits 44 on the bottom portion of the opening 41 can be removed.

Moreover, although CF-based reaction products may be generated by the plasma of $CF_4$ gas, the amount of CF-based reaction products generated by the plasma of $CF_4$ gas is considerably smaller than the amount of CF-based reaction products generated by a plasma of $C_4F_8$ gas or $C_4F_6$ gas. Hence, it is possible to prevent a large amount of CF-based reaction products from being deposited on the surfaces of the components in the chamber 11 during the step S31.

In the experiment, the present inventors have investigated the effects of parameters of a processing condition of the step S31 to the deposition state of the CH-based deposits 44 on the bottom portion of the opening 41. Specifically, the processing conditions include a pressure in the reaction chamber 15, a flow rate of $CH_4$ gas, a flow rate of $CF_4$ gas, a high frequency power for plasma generation (about 100 MHz) and processing time. As a result, it has been found that when the parameters of the processing condition are within the ranges shown in following Table 1, the CH-based deposits 44 can be prevented from remaining on the bottom portion of the opening 41.

TABLE 1

|  |  | minimum | maximum | optimum |
| --- | --- | --- | --- | --- |
| Pressure (mTorr) |  | 30 | 60 | 50 |
| Flow rate | $CH_4$ (sccm) | 20 | 30 | 25 |
|  | $CF_4$ (sccm) | 100 | 500 | 280 |
| High frequency power | for plasma generation (W) | 1000 | 2400 | 1400 |
|  | for ion attraction (W) | 0 | 0 | 0 |
| Time (sec) |  | 5 | 30 | 20 |

Further, it has been found that when the parameters of the processing condition are in the optimum ranges, the width of the opening 41 can be reduced by about 20 nm in the step S31.

In the above experiment, the present inventors have obtained the following information on the parameters of the processing condition in the step S31.

1. When the pressure in the reaction chamber 15 is smaller than about 30 mTorr, $CH_4$ gas is hardly dissociated and, therefore, a small amount of plasma is generated from $CH_4$ gas. Accordingly, a small amount of CH-based deposits 44 is generated, and the width of the opening 41 cannot be reduced to a desired level. On the other hand, when the pressure in the reaction chamber 15 is greater than about 60 mTorr, $CH_4$ gas is easily dissociated and, thus, a large amount of plasma is generated from $CH_4$ gas. Hence, the CH-based deposits 44 are excessively generated and deposited on the bottom portion of the opening 41.

2. When the flow rate of $CH_4$ gas is greater than about 30 sccm, the CH-based deposits 44 are excessively generated and deposited on the bottom portion of the opening 41. On the other hand, when the flow rate of $CH_4$ gas is smaller than about 20 sccm, a small amount of CH-based deposits 44 is generated and, thus, the width of the opening 41 cannot be reduced to a desired level.

3. When the flow rate of $CF_4$ gas is greater than about 500 sccm, the generation of CH-based deposits 44 is suppressed and, thus, the width of the opening 41 cannot be reduced to a desired level. On the other hand, when the flow rate of $CF_4$ gas is smaller than about 100 sccm, a small amount of ions P is generated, so that the CH-based deposits 44 deposited on the bottom portion of the opening 41 cannot be removed.

4. When the high frequency power for plasma generation is smaller than about 1000 W, the ion attracting force generated by the bias potential is weak and, hence, the CH-based deposits 44 deposited on the bottom portion of the opening 41 cannot be removed. On the other hand, when the high frequency power for plasma generation is greater than about 2400 W, the dissociation of $CF_4$ gas is facilitated, and this increases the amount of fluorine radicals. Accordingly, the generation of CH-based deposits 44 is suppressed, and the width of the opening 41 cannot be reduced to a desired level.

5. When the processing time is shorter than about 5 seconds, the deposition of the CH-based deposits 44 is insufficiently and, thus, the width of the opening 41 cannot be reduced to a desired level. On the other hand, when the processing time is longer than about 30 seconds, the width of the opening 41 is excessively reduced more than desired.

Figure 5A:
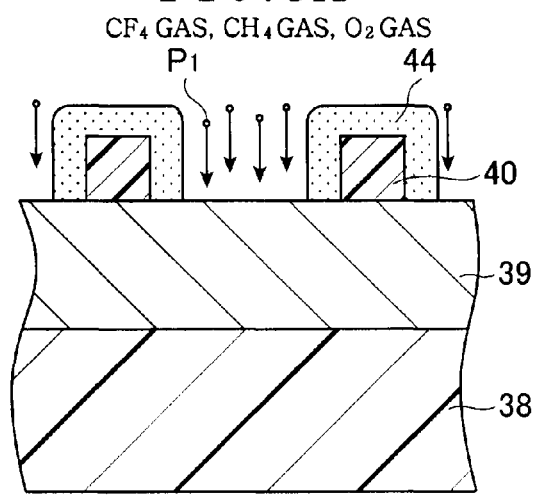
FIGS. 5A to 5C show a processing sequence of step S32 shown in FIG. 3.
Figure 5B:
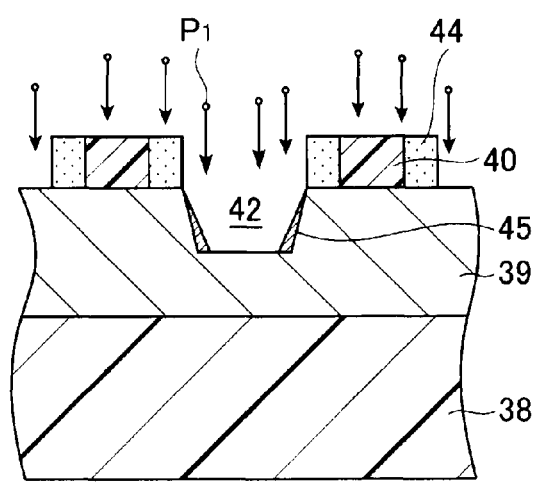
Figure 5C:
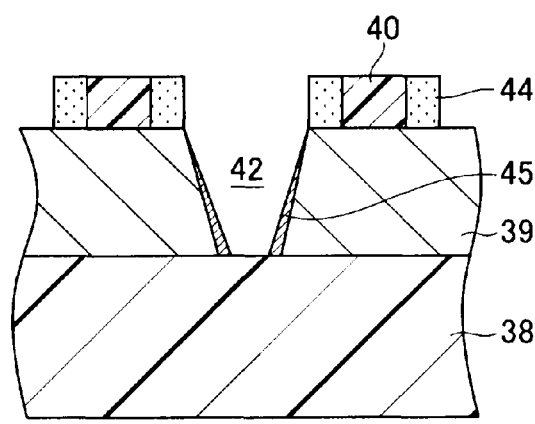

FIGS. 5A to 5C represent a processing sequence of the step S32 shown in FIG. 3.

Referring to FIGS. 5A to 5C, first of all, a gaseous mixture of $CF_4$ gas, $CH_4$ gas and $O_2$ gas is introduced as a processing gas from the shower head 30 into the reaction chamber 15 (FIG. 5A), and a plasma of each of $CF_4$ gas, $CH_4$ gas and $O_2$ gas is generated by applying the high frequency power for plasma generation from the second high frequency power supply 20 into the reaction chamber 15 via the susceptor 12. Moreover, the high frequency power for ion attraction is applied from the first high frequency power supply 18 to the susceptor 12.

Ions $P_1$ in the plasma of $CF_4$ gas are attracted to the hard mask layer 39 via the opening 41 by the bias potential generated by the high frequency power for ion attraction. Accordingly, the hard mask layer 39 is etched, and the opening 42 is formed. In that case, the plasma of $CF_4$ gas reacts with silicon in the hard mask layer 39, thereby generating CF-based reaction products. Even if these CF-based reaction products are deposited in the opening 42 isotropically, the ions $P_1$ collide with the bottom portion of the opening 42 in a direction perpendicular to the bottom portion of the opening 42 and, thus, the CF-based reaction products deposited on the bottom portion of the opening 42 are effectively removed. Eventually, no CF-based reaction products are deposited on the bottom portion of the opening 42.

On the other hand, it is difficult to remove the CF-based reaction products deposited on a side portion of the opening 42. This is because the ions $P_1$ collide with the side portion of the opening 42 not in a perpendicular direction but in a slanting direction. Further, the CF-based reaction products that are not removed serve as a side portion protective film 45 for protecting the side portion of the opening 42 (FIG. 5B), so that the side portion of the opening 42 can be prevented from being etched. Accordingly, the growth rate of the opening 42 is increased in the depth direction, but decreases in the width direction. As a result, the opening 42 is formed to have a tapered cross section, and the width of the opening 42 decreases toward the bottom portion (FIG. 5C). However, the amount of CF-based reaction products generated from the plasma of $CF_4$ gas is considerably smaller than that of CF-based reaction products generated from the plasma of $C_4F_8$ gas or $C_4F_6$ gas.

Besides, oxygen radicals generated from $O_2$ gas react with and remove the CH-based deposits 44 and/or the side portion protective film 45 made of the CF-based reaction products during the formation of the opening 42. As a consequence, a tapered angle of the cross section of the opening 42 is controlled.

In accordance with the step S32 of the multi-step shrink/etching process shown in FIG. 3, plasmas shown in $CF_4$ gas, $CH_4$ gas and $O_2$ gas are generated by applying the high frequency power for ion attraction and the high frequency power for plasma generation to the susceptor 12. Thus, the opening 42 is formed to have a tapered cross section, and the generation of a large amount of CF-based reaction products is prevented. Hence, it is possible to prevent the adhesion of a large amount of CF-based reaction products from being onto the surfaces of the components in the chamber 11, and also possible to prevent unwanted generation of fluorine in post-processes.

In the experiment, the present inventors have investigated the effects of parameters of a processing condition in the step S32 to the formation of a tapered shape of the opening 42. Specifically, the processing condition include a pressure in the reaction chamber 15, a flow rate of $CH_4$ gas, a flow rate of $CF_4$ gas, a flow rate of $O_2$ gas, a level of a high frequency power for plasma generation (about 100 MHz) and a level of a high frequency power for ion attraction (about 2 MHz). As a result, it has been found that the opening 42 can be formed in a desired tapered shape when the parameters of the processing condition are within the ranges shown in following Table 2.

TABLE 2

|  |  | minimum | maximum | optimum |
|---|---|---|---|---|
| Pressure (mTorr) |  | 5 | 30 | 10 |
| Flow rate | $CH_4$ (sccm) | 10 | 30 | 20 |
|  | $CF_4$ (sccm) | 100 | 500 | 280 |
|  | $O_2$ (sccm) | 0 | 20 | 10 |
| High frequency power | for plasma generation (W) | 1000 | 2400 | 1200 |
|  | for ion attraction (W) | 100 | 500 | 200 |

Further, it has been found that when the parameters of the processing condition are in the optimum ranges, a lowermost width of the opening 42 can be reduced by about 20 nm compared to an uppermost width of the opening 42 in the step S32.

In the above experiment, the present inventors have obtained the following information on the parameters of the processing condition in the step S32.

1. When the pressure in the reaction chamber 15 is smaller than about 5 mTorr, $CF_4$ gas is hardly dissociated. Therefore, a small amount of CF-based reaction products is generated, and the side portion protective film 45 becomes thin. Further, the ion energy increases due to the increase in the mean free path of the ions $P_1$ in the plasma of $CF_4$ gas, so that the side portion protective film 45 is strongly sputtered by the ions $P_1$. As a result, the side portion of the opening 42 is easily etched, and this makes it difficult to form the opening 42 having a tapered cross section. On the other hand, when the pressure in the reaction chamber 15 is greater than about 30 mTorr, $CF_4$ gas is easily dissociated and, hence, a large mount of CF-based reaction products is generated. Thus, the side portion protective film 45 becomes thick, and it is difficult to etch the side portion of the opening 42. As a result, the lowermost width of the opening 42 is reduced more than desired.

2. When the flow rate of $CH_4$ gas is greater than about 30 sccm, the CH-based deposits 44 are excessively generated and deposited on the bottom portion of the opening 42. Thus, it is difficult to form the opening 42 having a desired lowermost width. On the other hand, when the flow rate of $CH_4$ gas is smaller than about 10 sccm, a small amount of CH-based deposits is generated, and oxygen radicals become residual. Since the upper photoresist layer 40 and the like can be removed by the residual oxygen radicals in a short period of time, the shape of the opening 41 collapses and, further, the shape of the opening 42 formed by using the opening 41 collapses.

3. When the flow rate of $CF_4$ gas is greater than about 500 sccm, a large amount of ions $P_1$ is generated, and the side portion protective film 45 is strongly sputtered. Therefore, the side portion of the opening 42 is etched, and this makes it difficult to form the opening 42 having a tapered cross section. On the other hand, when the flow rate of $CF_4$ gas is smaller than about 100 sccm, a small amount of ions $P_1$ is generated, so that the side portion of the opening 42 is not sputtered. Accordingly, the lowermost width of the opening 42 is excessively reduced more than desired.

4. When the flow rate of $O_2$ gas is greater than about 20 sccm, the amount of oxygen radicals increases, and carbon and fluorine generated from $CF_4$ gas are scavenged by the oxygen radicals. Hence, the generation amount of CF-based reaction products decreases, and the side portion protective film 54 becomes thin. As a result, the side portion of the opening 42 is easily etched, and this makes it difficult to form the opening 42 having a tapered cross section.

5. When the high frequency power for plasma generation is smaller than about 1000 W, $CF_4$ gas is hardly dissociated and, hence, a small amount of CF-based reaction products is generated. Therefore, the side portion protective film 54 becomes thin, and the side portion of the opening 42 is easily etched. Accordingly, it is difficult to form the opening 42 having a tapered cross section. On the other hand, when the high frequency power for plasma generation is greater than about 2400 W, the dissociation of $CF_4$ gas is facilitated, and carbon radicals or fluorine radicals are generated instead of CF-based reaction products. Since the upper photoresist layer 40 and the like are removed in a short period of time by the fluorine radicals, the shape of the opening 41 collapses and, further, the shape of the opening 42 formed by using the opening 41 collapses.

6. When the high frequency power for ion attraction is smaller than about 100 W, the sputtering by the ions $P_1$ is suppressed. Hence, the formation of the opening 42 requires a long period of time, and the CF-based reaction products deposited on the bottom portion of the opening 42 cannot be removed. On the other hand, when the high frequency power for ion attraction is greater than about 500 W, the sputtering by the ions $P_1$ is facilitated. For that reason, the upper photoresist layer 40 as well as the hard mask layer 39 may be etched. Accordingly, the shape of the opening 41 collapses and, further, the shape of the opening 42 formed by using the opening 41 collapses.

Figure 6A:
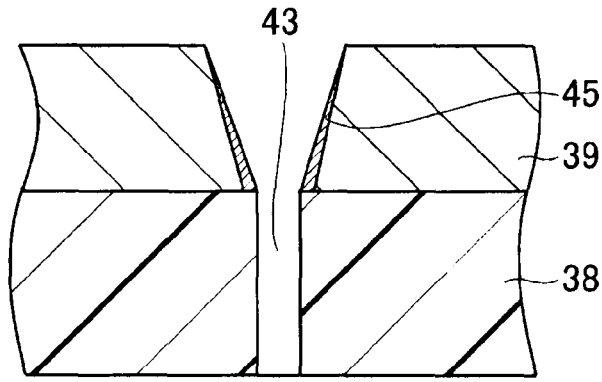
FIGS. 6A to 6C provide a processing sequence of step S34 shown in FIG. 3.
Figure 6B:
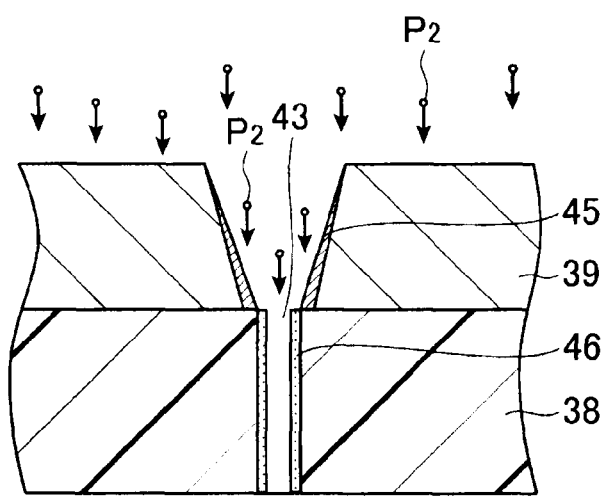
Figure 6C:
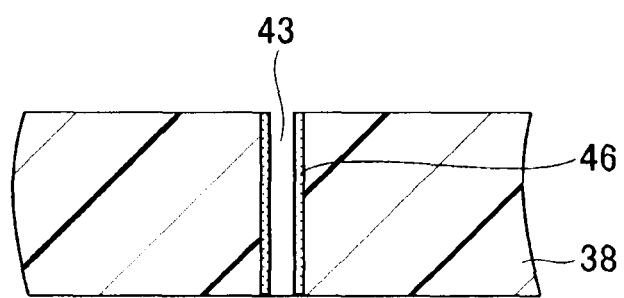

FIGS. 6A to 6C offer a processing sequence of the step S34 shown in FIG. 3.

Referring to FIGS. 6A to 6C, first of all, a gaseous mixture of $C_4F_8$ gas, Ar gas and $O_2$ gas is introduced as a processing gas from the shower head 30 into the reaction chamber 15 (FIG. 6A), and a plasma of each of $C_4F_8$ gas and $O_2$ gas is generated by applying the high frequency power for plasma generation from the second high frequency power supply 20 into the reaction chamber 15 via the susceptor 12. The plasma of $C_4F_8$ gas generates the CF-based reaction products 46, and the CF-based reaction products 46 thus generated are deposited in the opening 43 isotropically. In this case, since the amount of CF-based reaction products 46 generated from the plasma of $C_4F_8$ gas is considerably smaller than that generated from the plasma of $C_4F_6$ gas, a small amount of CF-based reaction products 46 is deposited in the opening 43 and on the surface of the hard mask layer 39.

Meanwhile, in the step S34, the high frequency power for ion attraction from the first high frequency power supply 18 is not applied to the susceptor 12. However, the high frequency power for plasma generation is applied to the susceptor 12, so that a bias potential for attracting ions $P_2$ in the plasma of $C_4F_8$ gas is generated. Accordingly, the CF-based reaction products 46 deposited on the bottom portion of the opening 43 and the hard mask layer 39 are sputtered by the ions $P_2$ (FIG. 6B). As a result, only the CF-based reaction products 46 deposited on the side portion of the opening 43 remain, which results in the reduction of the width of the opening 43 (FIG. 6C). Further, the hard mask layer 39 is removed.

However, as in the step S31, the ion attracting force generated by the bias potential generated by the high frequency power for ion attraction is weak. Hence, the ions $P_2$ attracted toward the bottom portion of the opening 43 are sufficient to sputter and remove the CF-based reaction products 46 deposited on the bottom portion of the opening 43, but are not sufficient to sputter and remove the target layer 37 covered by the CF-based reaction products 46.

In addition, Ar gas controls the removal amount of the CF-based reaction products 46 deposited on the bottom portion of the opening 43 by controlling the concentration of the plasma of $C_4F_8$ gas.

In accordance with the step S34 of the multi-step shrink/etching process shown in FIG. 3, a plasma is generated from a gaseous mixture of $C_4F_8$ gas, Ar gas and $O_2$ gas by applying the high frequency power for plasma generation to the susceptor 12 without applying the high frequency power for ion attraction to the susceptor 12. Therefore, the CF-based reaction products 46 deposited on the bottom portion of the opening 43 are sputtered without being left thereon.

In the experiment, the present inventors have investigated the effects of parameters of a processing condition in the step S34 to the deposition state of the CF-based reaction products 46 on the bottom portion of the opening 43 and the like. Specifically, the processing condition include a pressure in the reaction chamber 15, a flow rate of $C_4F_8$ gas, a flow rate of Ar gas, a flow rate of $O_2$ gas, a high frequency power for plasma generation (about 100 MHz) and processing time. As a result, it has been found that the CF-based reaction products 46 can be prevented from remaining on the bottom portion of the opening 43 when the parameters of the processing condition are within the ranges shown in following Table 3.

TABLE 3

|  |  | minimum | maximum | optimum |
|---|---|---|---|---|
| Pressure (mTorr) |  | 10 | 30 | 20 |
| Flow rate | $C_4F_8$ (sccm) | 30 | 60 | 50 |
|  | Ar (sccm) | 100 | 800 | 700 |
|  | $O_2$ (sccm) | 10 | 50 | 35 |
| High frequency power | for plasma generation (W) | 1000 | 2400 | 2000 |
|  | for ion attraction (W) | 0 | 0 | 0 |
| Time (sec) |  | 10 | 30 | 20 |

Further, it has been found that when the parameters of the processing condition are in the optimum ranges, the lowermost width of the opening 43 can be reduced by about 3 nm to 4 nm in the step S34.

In the above experiment, the present inventors have obtained the following information on the parameters of the processing condition in the step S34.

1. When the pressure in the reaction chamber 15 is smaller than about 10 mTorr, $C_4F_8$ gas is hardly dissociated and, thus, a small amount of CF-based reaction products 46 is generated. Therefore, the width of the opening 43 cannot be reduced to a desired level. On the other hand, when the pressure in the reaction chamber 15 is greater than about 30 mTorr, $C_4F_8$ gas is easily dissociated. Therefore, the CF-based reaction products 46 are excessively generated and deposited on the bottom portion of the opening 43 and the like.

2. When the flow rate of $C_4F_8$ gas is greater than about 60 sccm, the CF-based reaction products 46 are excessively generated and deposited on the bottom portion of the opening 43. On the other hand, when the flow rate of $C_4F_8$ gas is smaller than about 30 sccm, a small amount of CF-based deposits 46 is generated, and the width of the opening 43 cannot be reduced to a desired level.

3. When the flow rate of Ar gas is greater than about 800 sccm, the concentration of carbon radicals or fluorine radicals generated from $C_4F_8$ gas decreases, and the generation of the CF-based reaction products 46 is suppressed. Thus, the width of the opening 43 cannot be reduced to a desired level. On the other hand, when the flow rate of Ar gas is smaller than about 100 sccm, the concentration of carbon radicals or fluorine radicals generated from $C_4F_8$ gas increases. Accordingly, the CF-based reaction products 46 are excessively generated and deposited on the bottom portion of the opening 43.

4. When the flow rate of $O_2$ gas is greater than about 50 sccm, a large amount of oxygen radicals is generated, and the reaction between the oxygen radicals and carbon radicals or between the oxygen radicals and the fluorine radicals is facilitated. Hence, the generation of CF-based reaction products 46 that protect the lower photoresist layer 38 is suppressed. For that reason, the lower photoresist layer 38 (the side portion of the opening 43) may be etched. On the other hand, the flow rate of $O_2$ gas is smaller than about 10 sccm, a small amount of oxygen radicals is generated, which results in the generation of the CF-based reaction products 46. Accordingly, it is not possible to completely remove the CF-based reaction products 46 deposited on the bottom portion of the opening 43.

5. When the high frequency power for plasma generation is smaller than about 1000 W, the ion attracting force generated by the bias potential is weakened considerably, so that the CF-based reaction products 46 deposited on the bottom portion of the opening 43 cannot be removed. On the other hand, when the high frequency power for plasma generation is greater than about 2400 W, the dissociation of $O_2$ gas is facilitated, and a large amount of oxygen radicals is generated. Further, the reaction between the oxygen radicals and carbon radicals or the reaction between the oxygen radicals and fluorine radicals is facilitated. Accordingly, the generation of the CF-based reaction products 46 that protect the lower photoresist layer 38 (the side portion of the opening 43) is suppressed, which allows the lower photoresist layer 38 to be etched.

6. When the processing time is shorter than or equal to about 10 seconds, the deposition of the CF-based reaction products 46 is not sufficiently carried out and, hence, the width of the opening 43 cannot be reduced to a desired level. On the other hand, when the processing time is longer than or equal to about 30 seconds, the width of the opening 43 is excessively reduced more than desired.

As described above, the CH-based deposits 44 are not deposited on the bottom portion of the opening 41 during the step S31; the adhesion of a large amount of the CF-based reaction products onto the surfaces of the components in the chamber 11 does not occur during the step S32; and the CF-based reaction products 46 are not deposited on the bottom portion of the opening 43 and the surface of the hard mask layer 39 during the step S34, so that the hard mask layer 39 can be removed. That is, the steps S31, S32 and S34 can prevent any adverse effect from affecting post-processes.

Moreover, in accordance with the multi-step shrink/etching process shown in FIG. 3, the steps S31, S32 and S34 prevent any adverse effect from affecting post-processes. Therefore, it is unnecessary to move the wafer W to another plasma processing apparatus having, e.g., a chamber in which CF-based reaction products are not deposited on surfaces of components to prevent any adverse effect from affecting post-processes. Further, a throughput can be improved by performing the steps S31 to S35 in the same plasma processing apparatus 10.

Furthermore, in accordance with the multi-step shrink/etching process shown in FIG. 3, in step S35, an opening is formed by etching the target layer 37 via the opening 43 having the reduced width. Therefore, an opening having an extremely small width can be formed in the target layer 37.

In addition, the openings 41 to 43 may be via holes or trenches.

Figure 7A:
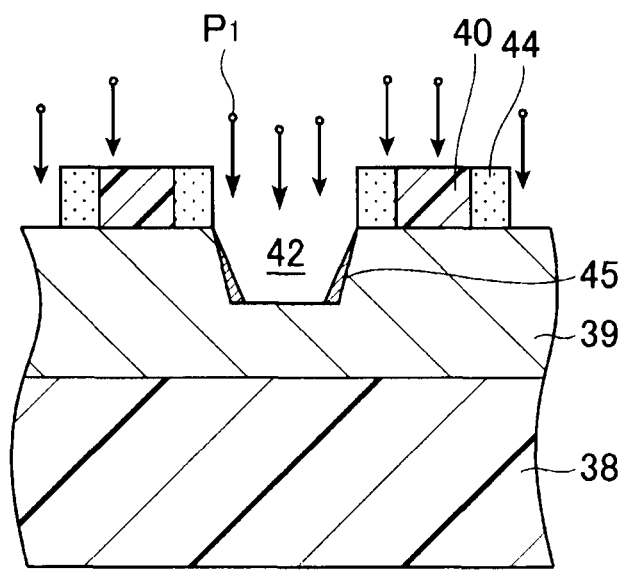
FIGS. 7A to 7C offer a processing sequence showing a first modification of the multi-step shrink/etching process shown in FIG. 3.
Figure 7B:
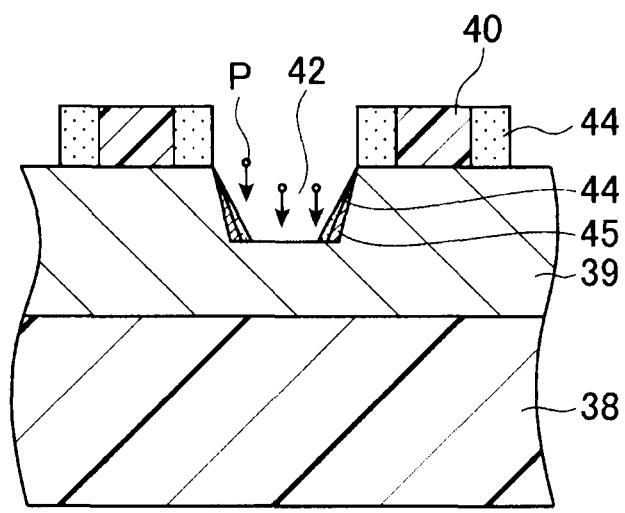
Figure 7C:
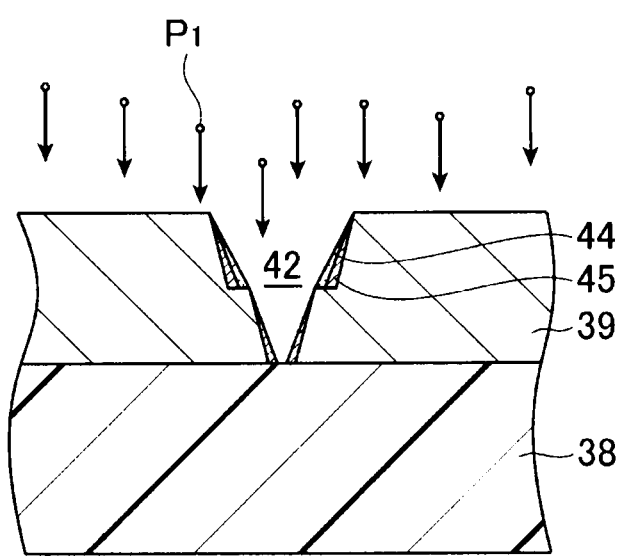

FIGS. 7A to 7C are a processing sequence of a first modification of the multi-step shrink/etching process shown in FIG. 3.

Referring to FIGS. 7A to 7C, first of all, the step S31 is performed to reduce the width of the opening 41 by depositing the CH-based deposits 44 generated from the plasma of $CH_4$ gas in the opening 41.

Next, the step S32 is performed to form the opening 42 in the hard mask layer 39 by etching using ions $P_1$ in the plasma of $CF_4$ gas, and the side portion protective film 45 is formed on a side portion of the opening 42 by using the CF-based reaction products so that the opening 42 can have a tapered cross section. The step S32 is stopped when the depth of the opening 42 in the thickness direction of the hard mask layer 39 reaches a predetermined level (FIG. 7A).

Then, the step S31 is performed again to deposit the CH-based deposits 44 in the opening 42. In that case, the high frequency power for plasma generation is applied to the susceptor 12 without applying the high frequency power for ion attraction to the susceptor 12. Therefore, the ion attracting force generated by the bias potential is weakened. For that reason, the ions P in the plasma of $CF_4$ gas are sufficient to sputter and remove the CH-based deposits 44 deposited on the bottom portion of the opening 42, but not sufficient to remove the hard mask layer 39. As a result, the opening 42 does not grow in the thickness direction of the hard mask layer 39, whereas only the width of the opening 42 is reduced. This facilitates the formation of the opening 42 (FIG. 7B) having a tapered shape. At this time, the step S31 is carried out for a predetermined period of time.

Thereafter, the step S32 is performed again. In the step S32, the opening 42 grows in the hard mask layer 39 in the thickness direction of the hard mask layer 39, and the side portion protective film 45 is formed on the side portion of the grown opening 42. As a consequence, the opening 42 having a tapered cross section is formed.

As described above, the steps S31 and S32 are repeated until the lower photoresist layer 38 is exposed through the opening 42 (FIG. 7C). Although FIG. 7 shows the case where the step S32 is performed twice and the step S31 is performed once, the repetition number of the steps S32 and S31 is not limited thereto.

Next, this process is completed by performing the steps S33 to S35.

In accordance with the first modification of the multi-step shrink/etching process shown in FIG. 3, due to the repetition of the steps S31 and S32, the formation of the opening 42 having a tapered shape can be facilitated. Hence, the lowermost width of the opening 42 can be further reduced.

Figure 8A:
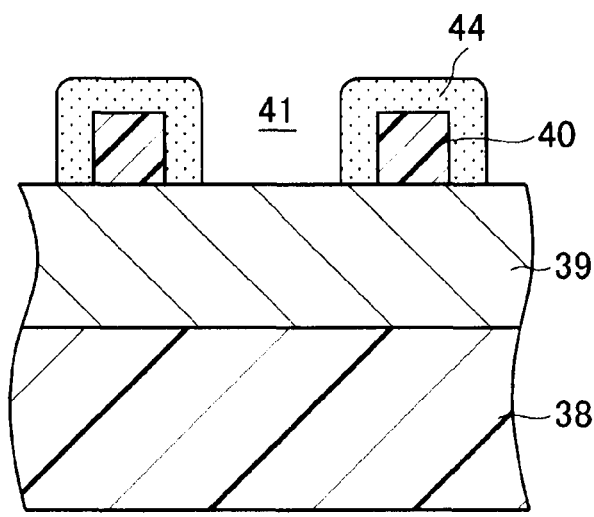
FIGS. 8A to 8C present a processing sequence showing of a second modification of the multi-step shrink/etching process shown in FIG. 3.
Figure 8B:
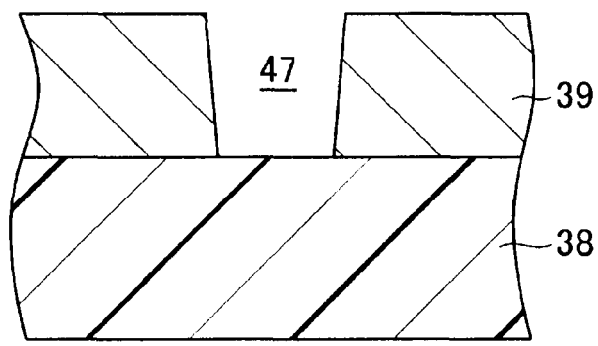
Figure 8C:
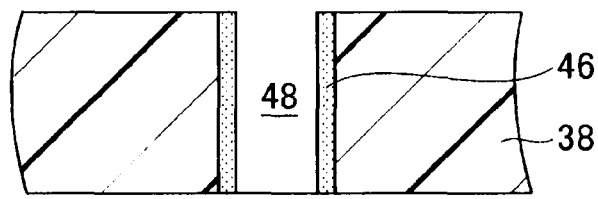

FIGS. 8A to 8C represent a processing sequence of a second modification of the multi-step shrink/etching process shown in FIG. 3.

Referring to FIGS. 8A to 8C, first of all, the step S31 is performed to reduce the width of the opening 41 by depositing the CF-based deposits 44 generated from the plasma of $CH_4$ gas in the opening 41 (FIG. 8A).

Next, the gaseous mixture of $CF_4$ gas and $O_2$ gas is introduced as a processing gas from the shower head 30 into the reaction chamber 15, and a plasma of each of $CF_4$ gas and $O_2$ gas is generated by applying the high frequency power for plasma generation from the second high frequency power supply 20 into the reaction chamber 15 via the susceptor 12. Moreover, the high frequency power for ion attraction is applied from the first high frequency power supply 18 to the susceptor 12 (second opening forming step).

The ions in the plasma of $CF_4$ gas are attracted to the hard mask layer 39 by the bias potential generated by the high frequency power for ion attraction. Accordingly, the hard mask layer 39 is etched, and an opening 47 is formed. In that case, since $CH_4$ gas is not used, CH-based deposits are not generated, and oxygen radicals used to remove CH-based deposits become residual. The residual oxygen radicals suppresses the generation of the CF-based reaction products, so that the side portion protective film 45 becomes thin. Therefore, the side portion of the opening 47 is easily etched, and the tapered angle of the opening 47 becomes greater than that of the opening 42. As a consequence, the lowermost width of the opening 47 is greater than the width of the opening 42 (FIG. 8B).

Next, this process is completed by performing the steps S33 to S35. Further, in the step S33, the lower photoresist layer 38 is etched via the opening 47 having a lowermost width greater than the width of the opening 42, so that the width of an opening 48 formed in the lower photoresist layer 38 is greater than that of the opening 43. Accordingly, even if the width of the opening 48 is reduced in the step S34, the reduced width of the opening 48 is greater than the width of the opening 43 which is reduced in the step S34 of the multi-step shrink/etching process shown in FIG. 3, but is smaller than at least the width of the opening 41 (FIG. 8C).

In accordance with the second modification of the multi-step shrink/etching process shown in FIG. 3, the target layer 37 is etched via the opening 48 having a width smaller than that of the opening 41, so that an opening having a small width can be formed in the target layer 37.

Figure 9A:
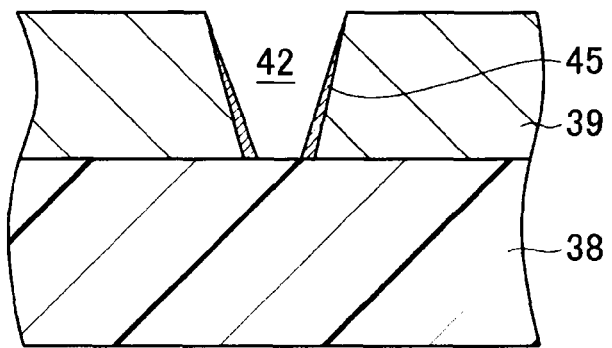
FIGS. 9A to 9C show a processing sequence showing a third modification of the multi-step shrink/etching process shown in FIG. 3.
Figure 9B:
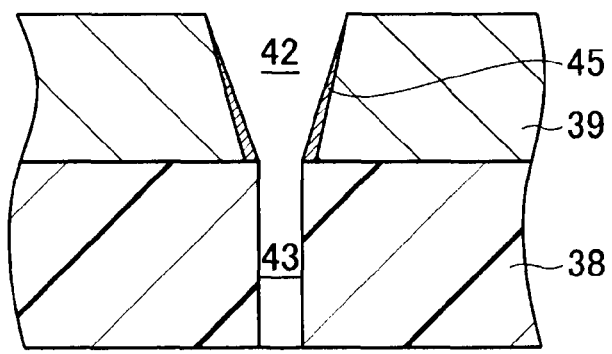
Figure 9C:
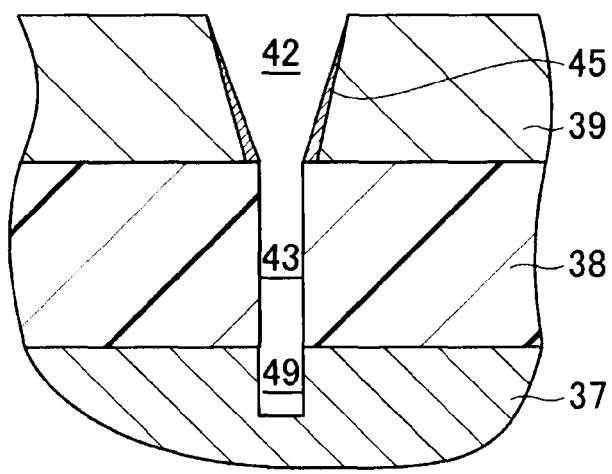
Figure 10A:
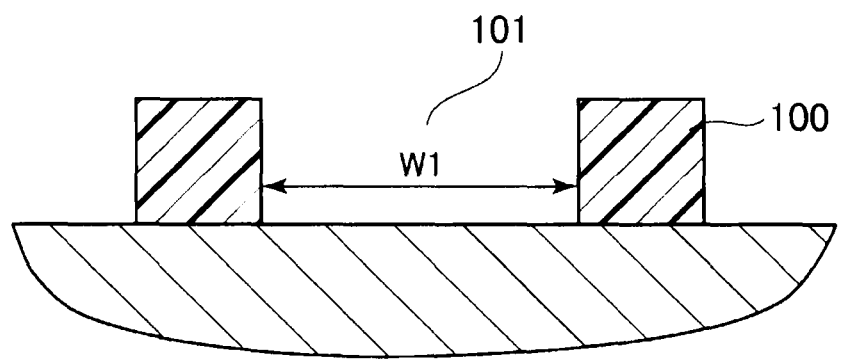
FIGS. 10A to 10C are a processing sequence showing a conventional shrink process.
Figure 10B:
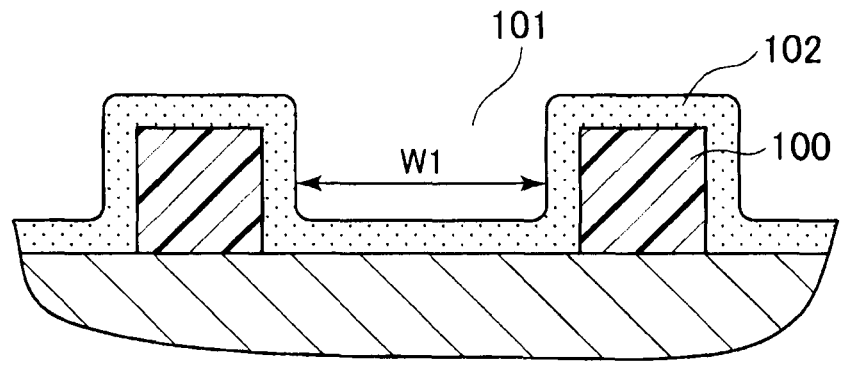
Figure 10C:
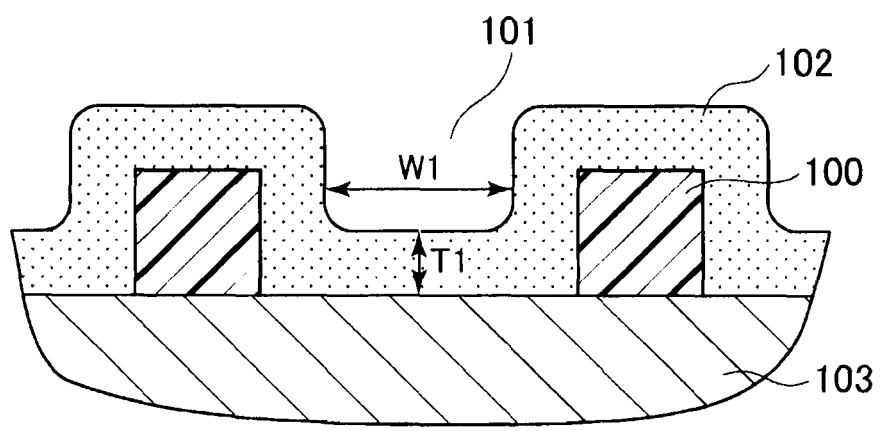

FIGS. 9A to 9C offer a processing sequence of a third modification of the multi-step shrink/etching process shown in FIG. 3.

Referring to FIGS. 9A to 9C, first of all, the width of the opening 41 is reduced by performing the step S31, and the opening 42 having a tapered cross section is formed in the hard mask layer 39 by performing the step S32 (FIG. 9A).

Next, the opening 43 is formed in the lower photoresist layer 38 by performing the step S33 (FIG. 9B) and, then, an opening 49 is formed in the target layer 37 by performing the step S35 without performing the step S34 (FIG. 9C). Thereafter, this process is completed. Since the step S34 is not carried out, the width of the opening 43 is not reduced. However, the width of the opening 43 is smaller than at least the width of the opening 41.

In accordance with the third modification of the multi-step shrink/etching process shown in FIG. 3, the target layer 37 is etched via the opening 43 having a width smaller than that of the opening 41, so that an opening having a small width can be formed in the target layer 37.

A substrate subjected to a plasma etching process in the above-described embodiments is not limited to a wafer for semiconductor devices, and may be various substrates for used in an LCD (Liquid Crystal Display), an FPD (Flat Panel Display) and the like, a photomask, a CD substrate, a printed circuit board or the like.

While the invention has been shown and described with respect to the embodiments, it will be understood by those skilled in the art that various changes and modification may be made without departing from the scope of the invention as defined in the following claims.

What is claimed is:

1. A substrate processing method for processing a substrate mounted on a mounting table to which a first high frequency power and a second high frequency power having a frequency higher than that of the first high frequency power are applied, the substrate having a structure in which a lower photoresist layer, a hard mask layer containing silicon, and an upper photoresist layer are sequentially formed on a target layer to be processed, the substrate processing method comprising:
   a first width reducing step of reducing, by using a plasma, a width of a first opening formed in the upper photoresist layer, so that the hard mask layer is exposed through the first opening;
   a second width reducing step of reducing, by using a plasma, a width of a second opening formed in the hard mask layer through the first opening having the reduced width so that the lower photoresist layer is exposed;
   a third opening forming step of forming a third opening in the lower photoresist layer through the second opening having the reduced width so that the target layer is exposed; and
   a third width reducing step of reducing a width of the third opening by using a plasma,
   wherein in the first width reducing step, the plasma is generated from a gaseous mixture of $CF_4$ gas and $CH_4$ gas by applying the second high frequency power to the mounting table without applying the first high frequency power to the mounting table,
   wherein in the second width reducing step, the plasma is generated from a gaseous mixture including at least $CF_4$ gas and $CH_4$ gas by applying the first and the second high frequency power to the mounting table,
   wherein in the third width reducing step, the plasma is generated from a gaseous mixture including at least $C_4F_8$ gas by applying the second high frequency power to the mounting table without applying the first high frequency power to the mounting table,
   wherein in the first width reducing step, a flow rate of $CH_4$ gas is equal to or greater than about 20 sccm and equal to or smaller than about 30 sccm, and a flow rate of $CF_4$ gas is equal to or greater than about 100 sccm and equal to or smaller than about 500 sccm,
   wherein the flow rate of $CH_4$ gas is provided equal to or smaller than about 30 sccm in the first width reducing step, to prevent CH-based deposits from being excessively generated and deposited on a bottom portion of the first opening,
   wherein the flow rate of $CH_4$ gas is provided equal to or greater than about 20 sccm in the first width reducing step, so that CH-based deposits are sufficiently generated and the width of the first opening is reduced to a desired level,
   wherein the flow rate of $CF_4$ gas is provided equal to or smaller than about 500 sccm in the first width reducing step, to prevent suppression of generation of the CH-based deposits so that the width of the first opening is reduced to the desired level, and
   wherein the flow rate of $CF_4$ gas is provided equal to or greater than about 100 sccm in the first width reducing step so that CH-based deposits deposited on the bottom portion of the first opening are removed.

2. The substrate processing method of claim 1, wherein the first and the second width reducing steps are repeated before the third opening forming step.

3. The substrate processing method of claim 1, further comprising a target layer etching step of etching the target layer through the third opening having the reduced width.

4. The substrate processing method of claim 2, further comprising a target layer etching step of etching the target layer through the third opening having the reduced width.

5. A substrate processing method for processing a substrate mounted on a mounting table to which a first high frequency power and a second high frequency power having a frequency higher than that of the first high frequency power are applied, the substrate having a structure in which a photoresist layer is formed on a target layer to be processed, the substrate processing method comprising:
- a width reducing step of reducing, by using a plasma, a width of an opening formed in the photoresist film,
- wherein in the width reducing step, the plasma is generated from a gaseous mixture of $CF_4$ gas and $CH_4$ gas by applying the second high frequency power to the mounting table without applying the first high frequency power to the mounting table,
- wherein in the width reducing step, a flow rate of $CH_4$ gas is equal to or greater than about 20 sccm and equal to or smaller than about 30 sccm, and a flow rate of $CF_4$ gas is equal to or greater than about 100 sccm and equal to or smaller than about 500 sccm,
- wherein the flow rate of $CH_4$ gas is provided equal to or smaller than about 30 sccm in the width reducing step, to prevent CH-based deposits from being excessively generated and deposited on a bottom portion of the opening,
- wherein the flow rate of $CH_4$ gas is provided equal to or greater than about 20 sccm in the width reducing step, so that CH-based deposits are sufficiently generated and, the width of the opening is reduced to a desired level,
- wherein the flow rate of $CF_4$ gas is provided equal to or smaller than about 500 sccm in the width reducing step, to prevent suppression of generation of the CH-based deposits so that the width of the opening is reduced to the desired level, and
- wherein the flow rate of $CF_4$ gas is provided equal to or greater than about 100 sccm in the width reducing step so that CH-based deposits deposited on the bottom portion of the opening are removed.

6. A substrate processing method for processing a substrate mounted on a mounting table to which a first high frequency power and a second high frequency power having a frequency higher than that of the first high frequency power are applied, the substrate having a structure in which a hard mask layer containing silicon is formed on a target layer to be processed, the substrate processing method comprising:
- a width reducing step of forming an opening in the hard mask layer by using a plasma while reducing a width of the opening by using a plasma,
- wherein in the width reducing step, the plasma is generated from a gaseous mixture including at least $CF_4$ gas and $CH_4$ gas by applying the first and the second high frequency power to the mounting table,
- wherein in the width reducing step, a flow rate of $CH_4$ gas is equal to or greater than about 10 sccm and equal to or smaller than about 30 sccm, and a flow rate of $CF_4$ gas is equal to or greater than about 100 sccm and equal to or smaller than about 500 sccm,
- wherein the flow rate of $CH_4$ gas is provided equal to or smaller than about 30 sccm in the width reducing step, to prevent CH-based deposits from being excessively generated and deposited on a bottom portion of the opening,
- wherein the flow rate of $CH_4$ gas is provided equal to or greater than about 10 sccm in the width reducing step, to prevent deterioration of a shape of the opening,
- wherein the flow rate of $CF_4$ gas is provided equal to or smaller than about 500 sccm in the width reducing step, to prevent etching of a side portion of the opening, and thereby allow forming of the opening having a tapered cross section, and
- wherein the flow rate of $CF_4$ gas is provided equal to or greater than about 100 sccm in the width reducing step, for sputtering of the side portion of the opening, and thereby prevent excessive reduction of a lowermost width of the opening.

7. A substrate processing method for processing a substrate mounted on a mounting table to which a first high frequency power and a second high frequency power having a frequency is higher than that of the first frequency are applied, the substrate having a structure in which a lower photoresist layer, a hard mask layer containing silicon, and an upper photoresist layer are sequentially formed on a target layer to be processed, the substrate processing method comprising:
- a first width reducing step of reducing, by using a plasma, a width of a first opening formed in the upper photoresist layer so that the hard mask layer is exposed;
- a second opening forming step of forming a second opening in the hard mask layer through the first opening having the reduced width so that the lower photoresist layer is exposed;
- a third opening forming step of forming a third opening in the lower photoresist layer through the second opening having the reduced width so that the target layer is exposed; and
- a second width reducing step of reducing a width of the third opening by using a plasma,
- wherein in the first width reducing step, the plasma is generated from a gaseous mixture of $CF_4$ gas and $CH_4$ gas by applying the second high frequency power to the mounting table without applying the first high frequency power to the mounting table,
- wherein in the second width reducing step, the plasma is generated from a gaseous mixture including at least $C_4F_8$ gas by applying the second high frequency power to the mounting table without applying the first high frequency power to the mounting table,
- wherein in the first width reducing step, a flow rate of $CH_4$ gas is equal to or greater than about 20 sccm and equal to or smaller than about 30 sccm, and a flow rate of $CF_4$ gas is equal to or greater than about 100 sccm and equal to or smaller than about 500 sccm
- wherein the flow rate of $CH_4$ gas is provided equal to or smaller than about 30 sccm in the first width reducing step, to prevent CH-based deposits from being excessively generated and deposited on a bottom portion of the first opening,
- wherein the flow rate of $CH_4$ gas is provided equal to or greater than about 20 sccm in the first width reducing step, so that CH-based deposits are sufficiently generated and, the width of the first opening is reduced to a desired level,
- wherein the flow rate of $CF_4$ gas is provided equal to or smaller than about 500 sccm in the first width reducing step, to prevent suppression of generation of the CH-based deposits so that the width of the first opening is reduced to the desired level, and
- wherein the flow rate of $CF_4$ gas is provided equal to or greater than about 100 sccm in the first width reducing step so that CH-based deposits deposited on the bottom portion of the first opening are removed.

8. The substrate processing method of claim 7, further comprising a target layer etching step of etching the target layer through the third opening having the reduced width.

9. A substrate processing method for processing a substrate mounted on a mounting table to which a first high frequency power and a second high frequency power having a frequency higher than that of the first frequency are applied, the substrate having a structure in which a lower photoresist layer, a hard mask layer containing silicon, and an upper photoresist layer are sequentially formed on a target layer to be processed, the substrate processing method comprising:

a first width reducing step of reducing, by using a plasma, a width of a first opening formed in the upper photoresist layer so that the hard mask layer is exposed through the first opening;

a second width reducing step of reducing, by using a plasma, a width of a second opening formed in the hard mask layer through the first opening having the reduced width so that the lower photoresist layer is exposed; and a third opening forming step of forming a third opening in the lower photoresist layer through the second opening having the reduced width so that the target layer is exposed, wherein in the first width reducing step, the plasma is generated from a gaseous mixture of $CF_4$ gas and $CH_4$ gas by applying the second high frequency power to the mounting table without applying the first high frequency power to the mounting table, wherein in the second width reducing step, the plasma is generated from a gaseous mixture including at least $CF_4$ gas and $CH_4$ gas by applying the first and the second high frequency power to the mounting table, wherein in the first width reducing step, a flow rate of $CH_4$ gas is equal to or greater than about 20 sccm and equal to or smaller than about 30 sccm, and a flow rate of $CF_4$ gas is equal to or greater than about 100 sccm and equal to or smaller than about 500 sccm wherein the flow rate of $CH_4$ gas is provided equal to or smaller than about 30 sccm in the first width reducing step, to prevent CH-based deposits from being excessively generated and deposited on a bottom portion of the first opening, wherein the flow rate of $CH_4$ gas is provided equal to or greater than about 20 sccm in the first width reducing step, so that CH-based deposits are sufficiently generated and, the width of the first opening is reduced to a desired level, wherein the flow rate of $CF_4$ gas is provided equal to or smaller than about 500 sccm in the first width reducing step, to prevent suppression of generation of the CH-based deposits so that the width of the first opening is reduced to the desired level, and wherein the flow rate of $CF_4$ provided equal to or greater than about 100 sccm in the first width reducing step so that CH-based deposits deposited on the bottom portion of the first opening are removed.

10. The substrate processing method of claim 9, further comprising a target layer etching step of etching the target layer through the third opening.

11. The substrate processing method of claim 1, wherein in the second width reducing step, CF-based reaction products generated from $CF_4$ gas are deposited on a side portion of the second opening.

12. The substrate processing method of claim 6, wherein in the width reducing step, CF-based reaction products generated from $CF_4$ gas are deposited on a side portion of the opening.

13. The substrate processing method of claim 9, wherein in the second width reducing step, CF-based reaction products generated from $CF_4$ gas are deposited on a side portion of the second opening.

14. The substrate processing method of claim 1, wherein in the second width reducing step, a flow rate of $CH_4$ gas is equal to or greater than about 10 sccm and equal to or smaller than about 30 sccm, and a flow rate of $CF_4$ gas is equal to or greater than about 100 sccm and equal to or smaller than about 500 sccm.

15. The substrate processing method of claim 1, wherein in the third width reducing step, a flow rate of $C_4F_8$ gas is equal to or greater than about 30 sccm and equal to or smaller than about 60 sccm.

16. The substrate processing method of claim 1, wherein the first high frequency power is equal to or greater than 100 W and equal to or smaller than 500 W and the second high frequency power is equal to or greater than 1000 W and equal to or smaller than 2400 W.

17. The substrate processing method of claim 7, wherein the first high frequency power is equal to or greater than 100 W and equal to or smaller than 500 W and the second high frequency power is equal to or greater than 1000 W and equal to or smaller than 2400 W.

18. The substrate processing method of claim 9, wherein the first high frequency power is equal to or greater than 100 W and equal to or smaller than 500 W and the second high frequency power is equal to or greater than 1000 W and equal to or smaller than 2400 W.

* * * * *